US005729227A

United States Patent [19]

Park

[11] Patent Number: 5,729,227

[45] Date of Patent: Mar. 17, 1998

[54] DIGITAL AUDIO SIGNAL MIXING CIRCUIT

[75] Inventor: Pan-Ki Park, Ahnsan, Rep. of Korea

[73] Assignee: Samsung Electronics Co., Ltd., Kyungki-do, Rep. of Korea

[21] Appl. No.: 581,489

[22] Filed: Dec. 29, 1995

[30] Foreign Application Priority Data

Dec. 29, 1994 [KR] Rep. of Korea .................. 38498/1994

[51] Int. Cl.[6] .................................................. H03M 9/00

[52] U.S. Cl. .................................................. 341/100

[58] Field of Search .................................. 341/100, 101, 341/108, 110; 386/91; 360/8; 365/233; 375/240

[56] References Cited

U.S. PATENT DOCUMENTS 4,141,039 2/1979 Yamamoto ................................ 386/91

*Primary Examiner*—Brian K. Young

*Attorney, Agent, or Firm*—Sughrue, Mion, Zinn, Macpeak & Seas, PLLC

[57] ABSTRACT

A digital audio signal mixing circuit for mixing two digital audio signals which have sampling frequencies different from each other and for generating the mixed data of an analog format, includes: a first serial-parallel converting unit for converting first serial digital audio data into first parallel data in synchronism with a first bit clock; a second serial-parallel converting unit for converting second serial digital audio data into second parallel data in synchronism with a second bit clock; a first and a second latching unit for converting continually varying second parallel data into parallel data stabilized in one channel area, for respectively separating the converted parallel data into third data of a left channel and fourth data of a right channel, and for temporarily storing the separated data; a first selecting unit for selectively outputting one of the third and fourth data as fifth data in response to a signal representing whether the first parallel data is data of the left channel or data of the right channel, thereby mixing data according to the channel to which it belongs; an adding unit for mixing the first and fifth parallel data and outputting the mixed data as unitary sixth parallel data; a parallel-serial converting unit for converting the sixth parallel data into serial data in synchronism with the first bit clock; and a digital/analog converting unit for converting data outputted in the parallel-serial converting unit into analog format.

14 Claims, 8 Drawing Sheets

DIGITAL AUDIO SIGNAL MIXING CIRCUIT

BACKGROUND OF THE INVENTION

The present invention relates to a circuit for mixing digital audio signals having different sampling frequencies and different formats in a digital audio system and, in particular, to a digital audio signal mixing circuit having a simple circuit structure which can be produced at a reduced cost.

Generally, in multimedia devices which simultaneously use digital audio signals having various formats, a method for mixing the digital audio signals is employed which takes advantage of the respective advantages of the signal formats, uses the least amount of data and obtains the best possible effects. Conventionally, there are two methods for simultaneously reproducing two different digital audio data having sampling frequencies different from each other. One method is to instantaneously ignore one audio data and selectively reproduce only the other audio data. The other method reproduces the two digital audio data through respective reproducing paths and mixes the reproduced data with an analog signal. This is done because it is difficult to mix two digital audio signals due to distortion of phase. Also, multimedia devices for home appliances such as a CD-I (Interactive) machine use various digital audio signals, such as a general CD-I digital audio signal, an adaptive differential pulse code modulation (hereinafter, referred to as ADPCM) digital audio signal adopted in the CD-I machine, and a moving picture experts group (hereinafter, referred to as MPEG) audio signal newly adopted in the CD-I machine. From these digital audio signals, various effects can be obtained. There have existed examples of expressing background music as an MPEG audio signal and expressing other acoustic effects as ADPCM data. These effects can be embodied by using a plurality of digital/analog converters in accordance with the formats.

FIG. 1 is a block diagram illustrating the construction of a conventional digital audio signal mixing circuit which is used for simultaneously reproducing and mixing digital audio signals, such as, for example, a digital audio signal of a format A and a digital audio signal of a format B.

FIGS. 2A and 2B are wave forms illustrating formats of general digital audio data. Since FIGS. 2A and 2B are exemplary of formats of 16 bit digital audio signals having sampling frequencies different from each other, there is no problem in considering the above wave forms as the format A and the format B, respectively. When simultaneously reproducing and mixing the two digital audio signals having sampling frequencies different from each other, frequencies of clocks LRCK1 and LRCK2 for discriminating data of a right channel and data of a left channel should be different from each other and the frequencies of clocks SCLK1 and SCLK2 for exactly latching each of serial data SData1 and SData2 should be different from each other.

The circuit of FIG. 1 is comprised of a first digital/analog converter 11 which inputs the serial data SData1 of the format A, a clock BCLK1 for latching the serial data SData1 in a rising interval and the channel discriminating signal LRCK1 representing whether the serial data SData1 is data of the right channel or data of the left channel, and outputs both channel signals L1 and R1 in an analog signal format; a second digital/analog converter 12 which inputs the serial data SData2 of format B, a clock BCLK2 for latching the serial data SData2 in the rising interval and the channel discriminating signal LRCK2 representing whether the serial data SData2 is data of the right channel or data of the left channel, and outputs both channel signals L2 and R2 in analog signal format; a first mixer 13 for mixing the left channel signals L1 and L2 having the analog signal formats to generate a signal LOut, so as to reproduce the two audio signals at the same time; and a second mixer 14 for mixing the right channel signals R1 and R2 to generate a signal ROut, so as to reproduce the two audio signals at the same time.

However, as described above, in the event of mixing and reproducing the two audio signals, a method for separately using digital/analog converters according to the respective formats is required for mixing the analog signals. This results in complicated circuit structure and high production cost.

SUMMARY OF THE INVENTION

It is therefore an object of the present invention to provide a digital audio signal mixing circuit capable of having a simple circuit structure and reduced production cost.

This object can be achieved according to the principles of the present invention with a circuit for mixing a plurality of digital audio signals which have sampling frequencies different from one another and for generating the mixed signal in an analog format. The above circuit is comprised of a serial-parallel converting unit for converting serial digital audio data having various formats into parallel data in synchronism with a corresponding bit clock; an adding unit for mixing the parallel data and outputting the mixed data as signal parallel data; a parallel-serial converting unit for converting the signal parallel data into serial data in synchronism with a specific bit clock; and a digital/analog converting unit for converting the data outputted in the parallel-serial converting unit into analog format.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar elements components, wherein.

DETAILED DESCRIPTION OF THE PREFERRED EMBODIMENTS

In the following description, numerous specific details such as components and frequencies of a specific circuit, are set forth to provide a more thorough understanding of the present invention. It will be apparent, however, to one skilled in the art that the present invention may be practiced without these specific details. A detailed description of known functions and constructions unnecessarily obscuring the subject matter of the present invention will be avoided in the present invention.

Figure 1:
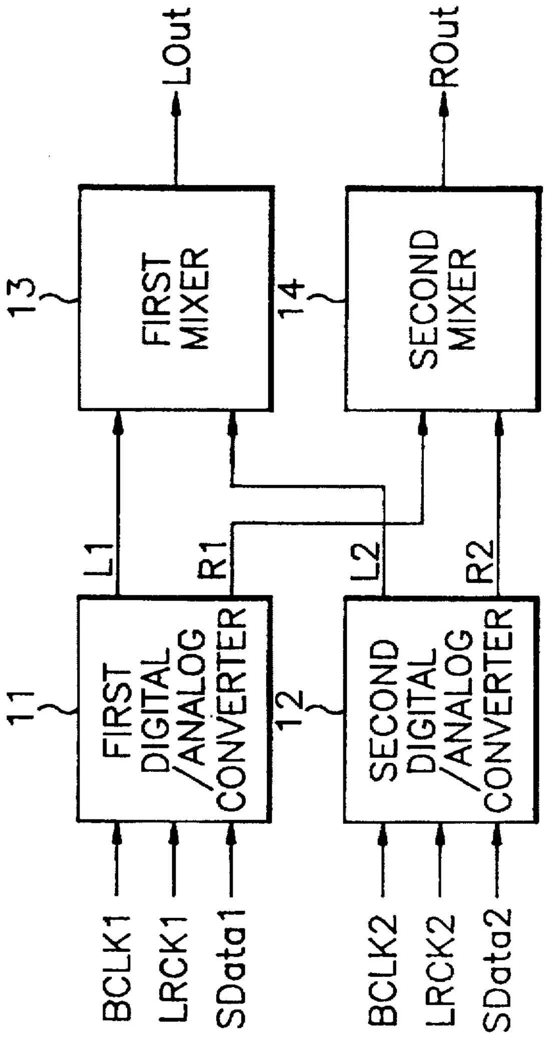
(PRIOR ART) FIG. 1
FIG. 1 is a block diagram illustrating the construction of a conventional digital audio signal mixing circuit.
Figure 2A:
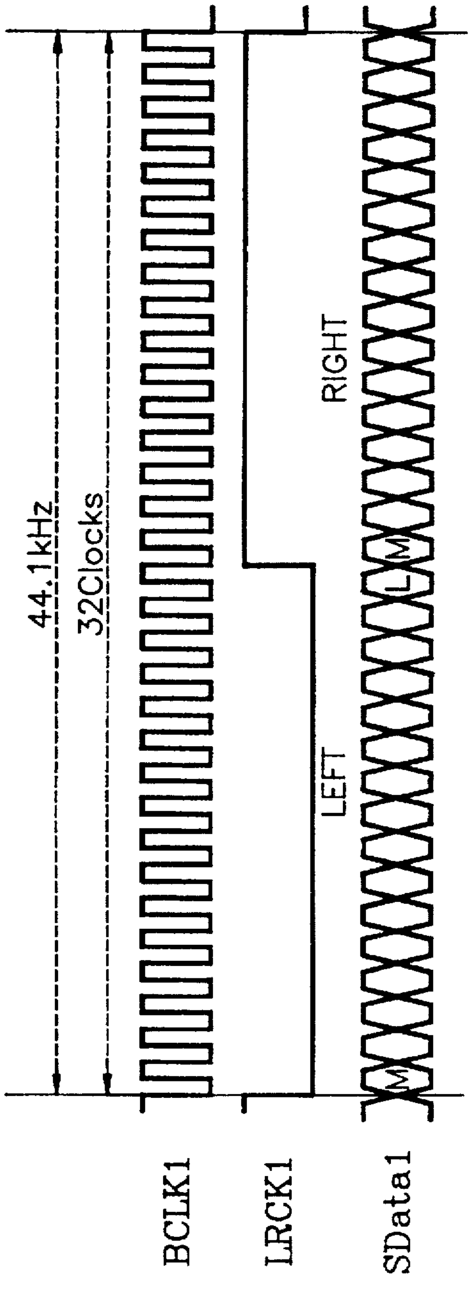
FIGS. 2A and 2B are wave forms illustrating formats of general digital audio data.
Figure 2B:
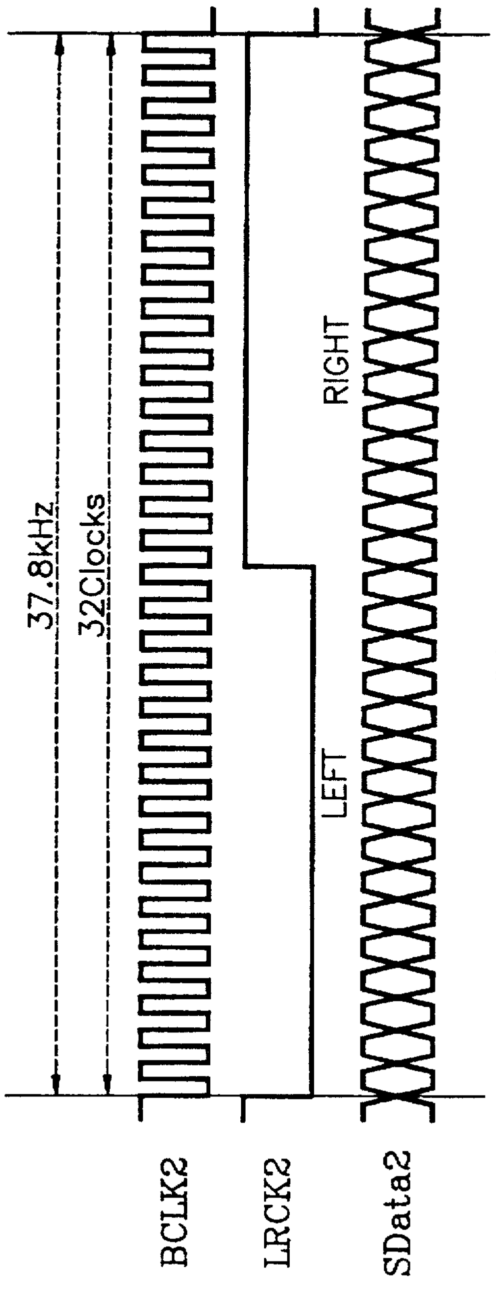
Figure 3:
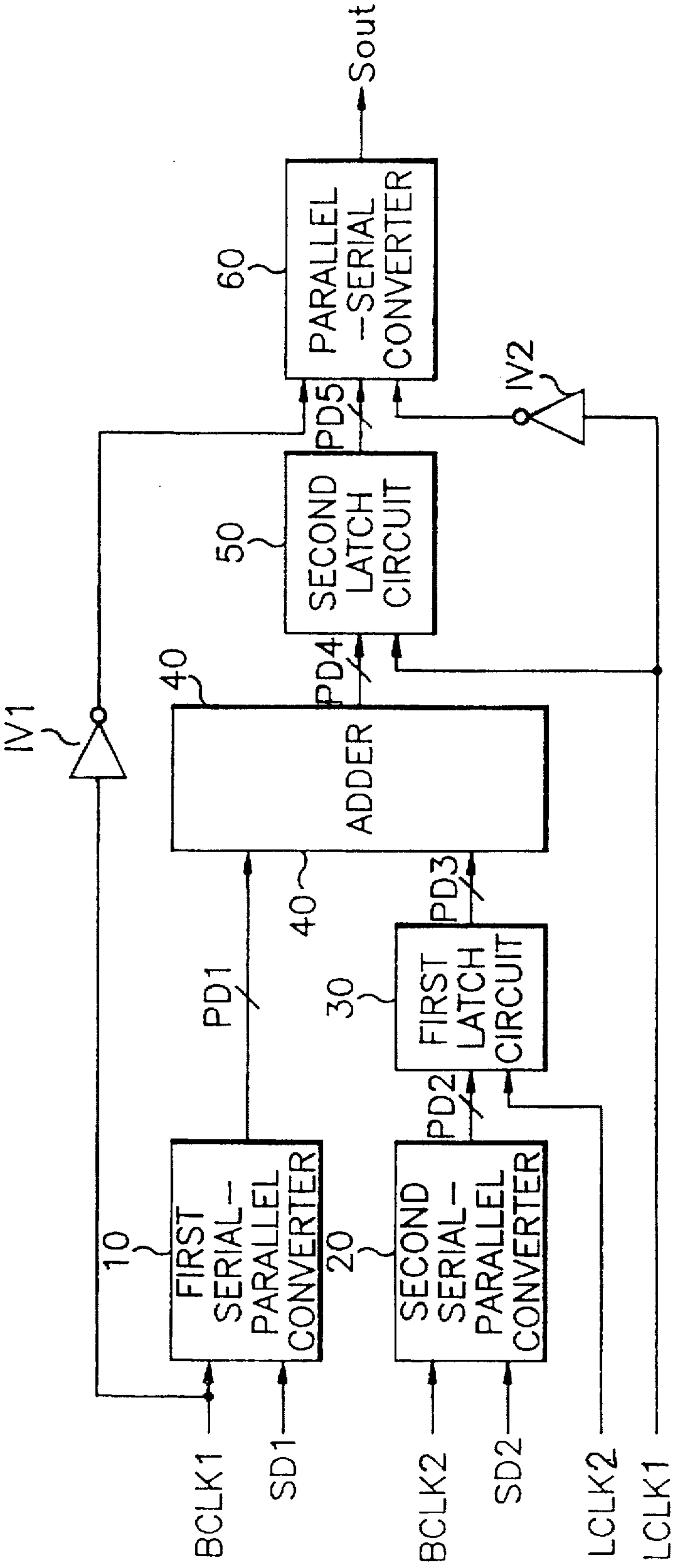
FIG. 3 is a block diagram illustrating the construction of a digital audio signal mixing circuit constructed according to the principles of the present invention.
Figure 4:
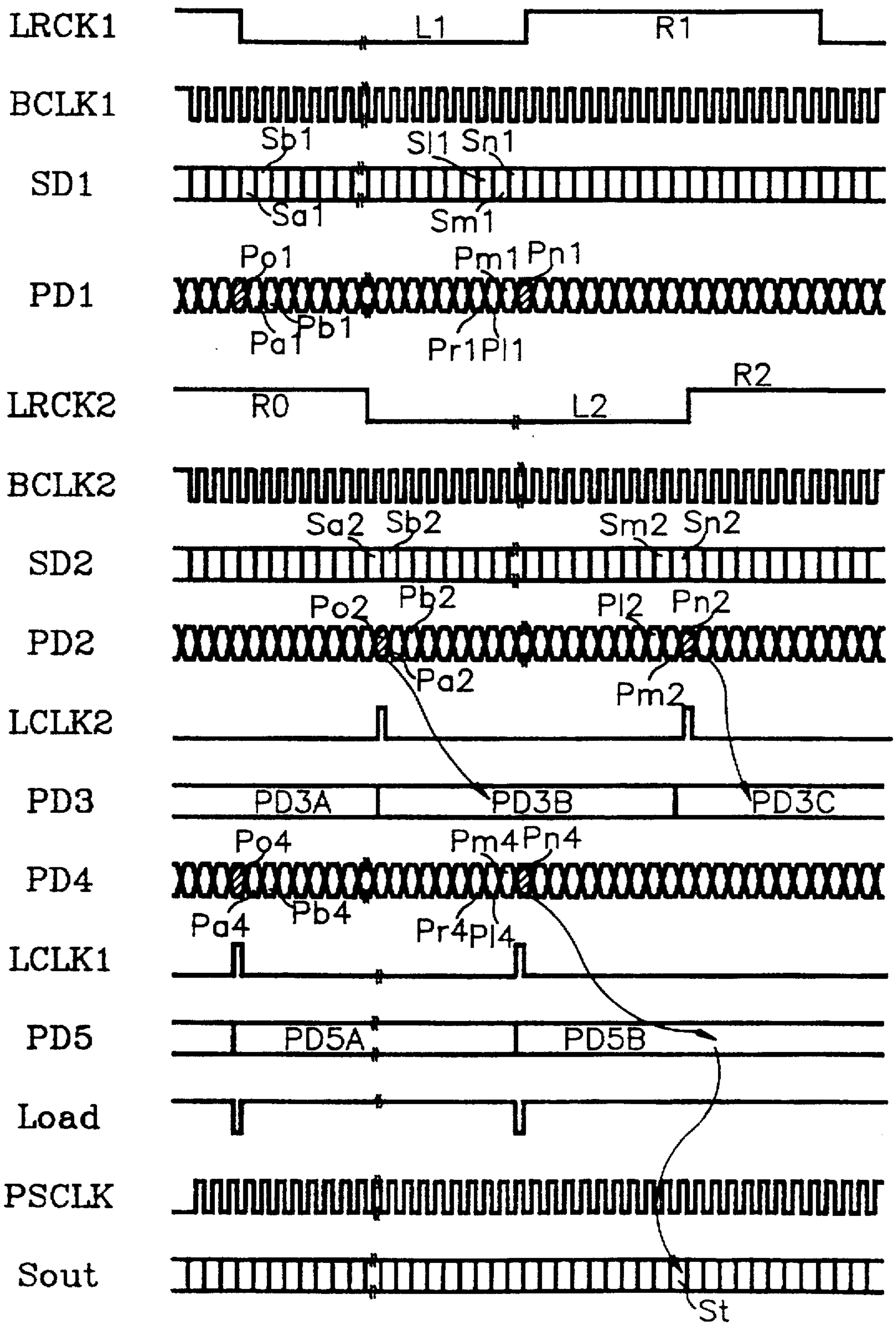
FIG. 4 is a timing diagram illustrating digital audio signal mixing processes according to the present invention.

FIG. 3 is a block diagram illustrating the construction of a digital audio signal mixing circuit constructed according to the principles of the present invention and FIG. 4 is a timing diagram illustrating digital audio signal mixing processes according to the present invention.

As shown in FIG. 3, a serial digital audio data mixing device according to the present invention is comprised of serial-parallel converters 10 and 20. Herein, the first serial-parallel converter 10 receives a bit clock BCLK1 and serial digital audio data SD1 and outputs digital audio data PD1. Also, the digital audio data PD1 is generated by converting serial data into parallel data with a rising edge trigger format so that a bit value is latched in a rising edge of the bit clock BCLK1. An explanation of the process by which the channel data Sa1, Sb1, . . . , Sm1, Sn1 corresponding to a left channel L1 among the serial digital audio data SD1 is mixed with channel data of other serial digital audio data SD2 having sampling frequencies different from each other will be given as an example hereinafter with reference to FIG. 4.

If a MSB bit Sa1 of the left channel L1 is inputted, the first serial-parallel converter 10 for outputting the inputted serial digital audio data SD1 16 bits by 16 bits in parallel, sequentially, latches the MSB bit Sa1 at the rising edge of the bit clock BCLK1, shifts the MSB bit Sa1 bit by bit by using a shift register, outputs in parallel as 16 bits parallel data Pa1 which is shifted one bit more than parallel data Po1 outputting a bit value of the left channel L1, converts and outputs a next MSB bit Sb1 inputted following the MSB bit Sa1 to the parallel data Pb1 shifted one bit more than the parallel data Pa1, and converts and outputs a LSB bit Sn1 of the left channel L1 into parallel data Pn1 shifted one bit more than parallel data Pm1. As described above, serial-parallel converting operations of the inputted data are sequentially performed at every period of the inputted bit clock BCLK1. However, whereas the parallel data Pa1, Pb1, . . . , Pm1 converted by the first serial-parallel converter 10 is not the 16 bits of data from the MSB bit Sa1 of the left channel L1 to the LSB bit Sn1 thereof converted into parallel data, the parallel data Pn1 of 16 bits which the first serial-parallel converter 10 parallel-outputs by receiving the LSB bit Sn1 is the 16 bits of data of the left channel L1 obtained by sampling in a given period of time.

In the meanwhile, the second serial-parallel converter 20 for outputting the serial digital audio data SD2 having a sampling frequency of 37.5 kHz 16 bits by 16 bits in parallel, sequentially, latches a MSB bit Sa2 of a left channel L2 of the serial digital audio data SD2 at a rising edge of a bit clock BCLK2, outputs parallel data Pa2 shifted one bit more than parallel data Po2 by using a shift register and outputs parallel data Pb2, Pc2, . . . , which are shifted one bit more than the parallel data Po2 during serial-parallel converting operations of the serial digital audio data SD2 inputted bit by bit in conformance with the bit clock BCLK2. This operation is like the above serial-parallel converting operations of the first serial-parallel converter 10.

Figure 5A:
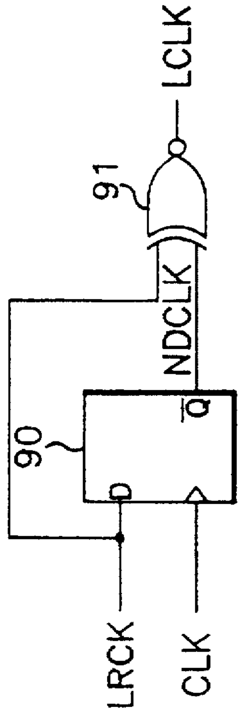
FIG. 5A is a detailed circuit diagram illustrating a latch clock generating circuit according to the present invention and FIG. 5B is a wave form illustrating operation of the latch clock generating circuit according to the present invention.
Figure 5B:
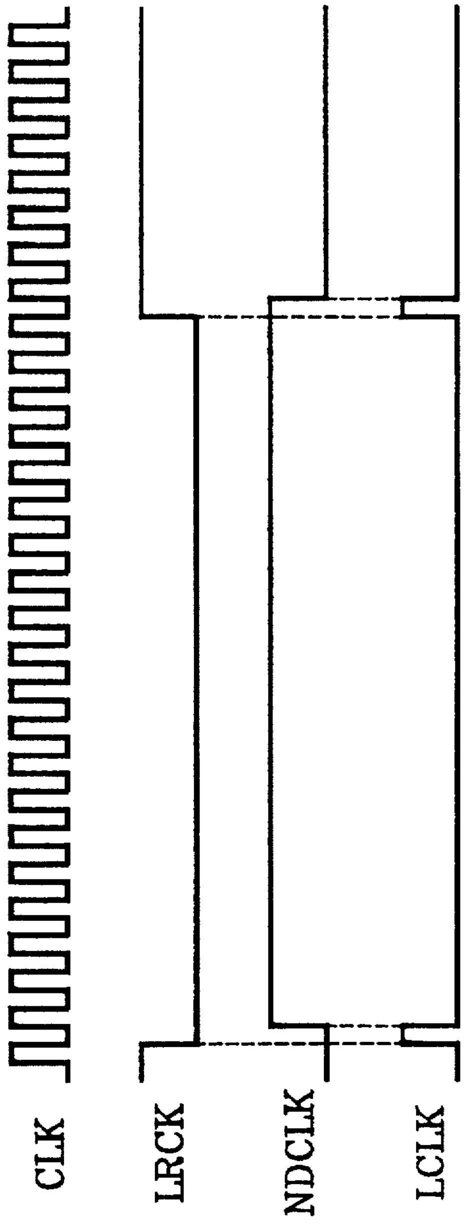

A clock is necessary for latching desired parallel data Pn2 among the parallel data Pa2, Pb2, Pc2 . . . , inputted to a first latch circuit 30. FIG. 5A is a detailed circuit diagram illustrating a latch clock generating circuit according to the present invention and FIG. 5B is a wave form illustrating an operation of the latch clock generating circuit according to the present invention. In FIG. 5A, a D flip-flop 90 receives a high frequency clock CLK and a channel discriminating clock LRCK and outputs a delay clock NDCLK delayed by 1 clock to an exclusive OR gate 91. Here, the exclusive OR gate 91 generates a latch clock by receiving one end of the channel discriminating clock LRCK inputted to a D-terminal of the D flip-flop 90. When the channel discriminating clock LRCK is converted from a logic "low" state to a logic "high" state or, conversely, when the channel discriminating clock LRCK is converted from the logic "high" state to the "low" state, that is, when the left and right channels are replaced with each other, the latch clock is clocked to the logic "high" state during one clock period, as shown in FIG. 5B.

Again, the first latch circuit 30 of FIG. 3 latches the desired parallel data Po2 and Pn2 among the parallel data Po2, Pa2, Pb2, Pc2, . . . , parallel-outputted while being shifted bit by bit by using the latch clock LCLK2 generated by the above latch clock generating circuit. In other words, in FIG. 4, in the case that a LSB bit So2 of a right channel R0 is latched by the second serial-parallel converter 20 (that is, in the case that the channel discriminating clock LRCK2 is converted from the logic "low" state to the logic "high" state), parallel data PD3B which the first latch circuit 30 outputs is data that the first latch circuit 30 outputs to an adder 40 by receiving the latch clock LCLK2 of the logic "high" state and latching the parallel data Po2 until the latch clock LCLK2 is converted from the logic "low" state to the logic "high" state. The adder 40 receives and operates on the parallel data PD1 and PD3 which the first serial-parallel converter 10 and the first latch circuit 30 output, and outputs the parallel data PD4 to a second latch circuit 50. For example, the adder 40 adds parallel data Pk1 to the parallel data PD3B and outputs parallel data Pk4. Herein, the parallel data Pk1 and the parallel data PD3B are inputted at the same time. Consequently, the adder 40 adds parallel data Pl1 to the parallel data PD3B and outputs the parallel data PD4. Therein, the parallel data Pl1 and the parallel data PD3B are inputted at an equal period of time. Through the operations described above, the parallel data Pm4 and Pn4, . . . , is sequentially outputted to the second latch circuit 50. The second latch circuit 50 latches the desired parallel data PD5B by using the latch clock LCLK 1 among the parallel data Pm4, Pn4 . . . , sequentially outputted by the adder 40 and outputs the parallel data PD5B to a parallel-serial converter 60 until the latch clock LCLK1 is again converted to the logic "high" state. If the parallel data PD5B of 16 bits is inputted, the parallel-serial converter 60 for receiving the parallel data PD5B by using a load clock Load and outputting serial digital audio data Sout in conformity to a clock PSCLK, latches the parallel data bit by bit at a falling edge of a clock PCLK and sequentially outputs the parallel data from the MSB bit St bit by bit in serial.

The load clock Load and the clock PSCLK respectively are converted through inverters IV2 and IV1 so as to conform with a set feature required for reading the bit value in the falling edge of the clock among features of the parallel-serial converter 60. Particularly, the load clock Load is the clock converting the latch clock LCLK2 whereas the clock PSCLK is the clock converting the bit clock BCLK1.

The parallel-serial converter 60 converts the serial data Sout into an analog signal by using a digital/analog converter and reproduces an audio signal by using well-known techniques.

Figure 6:
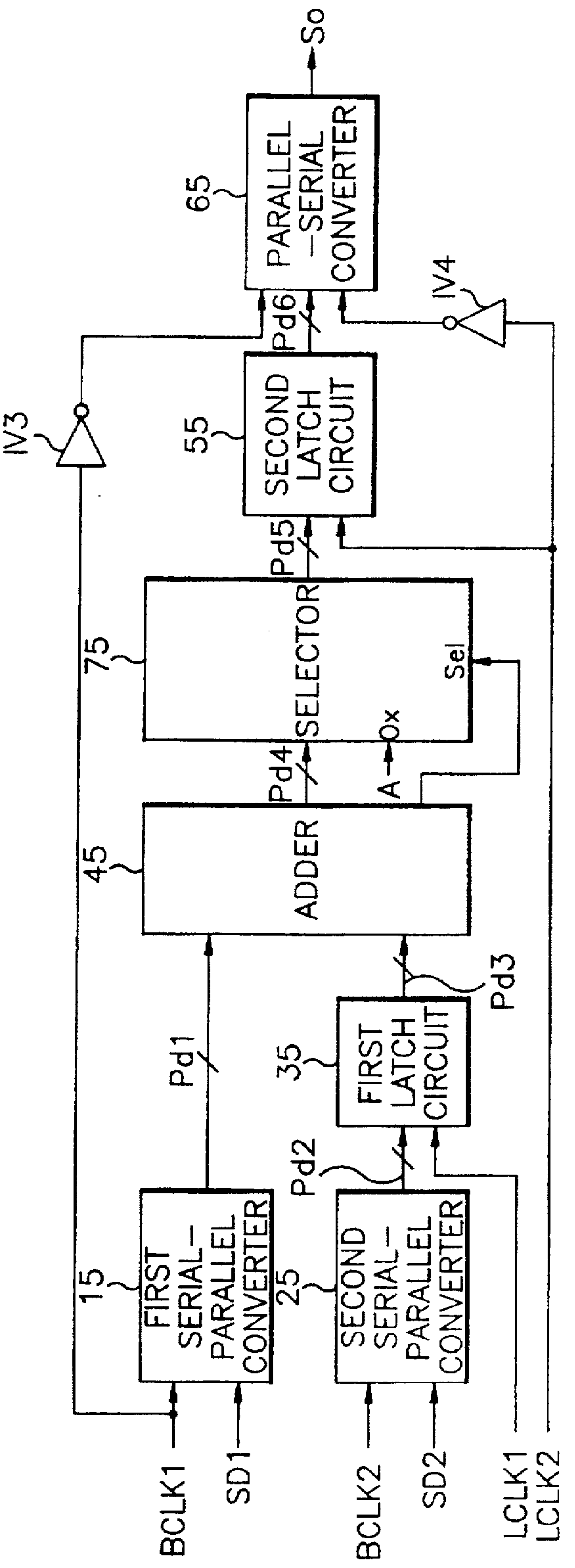
FIG. 6 is a block diagram illustrating the construction of a digital audio signal mixing circuit according to another embodiment of the present invention.

FIG. 6 is a block diagram illustrating the construction of a digital audio signal mixing circuit according to another embodiment of the present invention, in which an adder 45 is connected to a selector 75 for the purpose of preventing generation of an overflow that the adder 40 of the aforementioned embodiment may generate in the process of mixing two parallel data.

When the carry of the logic "high" state is outputted to a select terminal SEL in the case that the bit value of the parallel data Pd4 mixed in the adder 45 is more than maximum value of 16 bits, the selector 75 replaces the bit value with the maximum value A of 16 bits inputted to a terminal Ox. On the contrary, when the carry of the logic "low" state is outputted into the select terminal SEL in the case that the bit value of the parallel data Pd4 is equal to or less than the maximum value A of 16 bits, the selector 75 outputs the bit value of the inputted parallel data Pd4 in an intact state, thereby effectively preventing overflow which may be generated in the adder 45.

Figure 7:
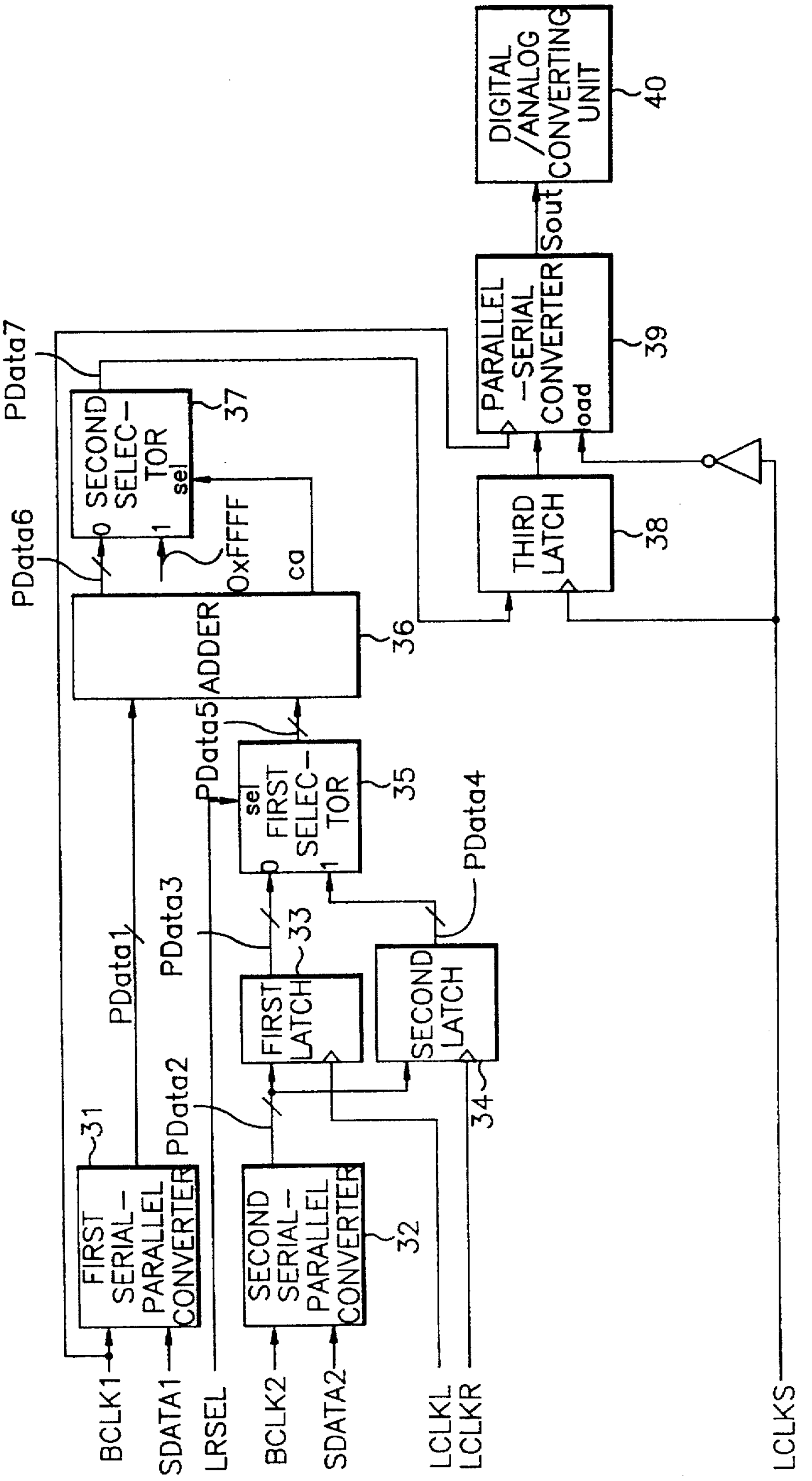
FIG. 7 is a block diagram illustrating the construction of a digital audio signal mixing circuit according to yet another embodiment of the present invention.

FIG. 7 is a block diagram illustrating the construction of a digital audio signal mixing circuit according to yet another embodiment of the present invention, which is comprised of a first serial-parallel converter 31 for receiving first serial digital audio data SData1 and a first bit clock BCLK1 corresponding to the first serial digital audio data SData1 and converting them into first parallel data PData1; a second serial-parallel converter 32 for receiving second serial digital audio data SData2 and a second bit clock BCLK2 corresponding to the second serial digital audio data SData2 and converting them into second parallel data PData2; first and second latches 33 and 34 for enabling continually varying second parallel data PData2 to be parallel data stabilized during one channel interval, for separating the converted parallel data into third data PData3 of the left channel and fourth data PData4 of the right channel and for temporarily storing the data; a first selector 35 for selecting one of the third and fourth data PData3 and PData4 according to a signal LRSEL representing whether the first parallel data PData1 is data of a left channel or data of a right channel and for outputting the selected data as fifth parallel data PData5, for the purpose of mixing the data of the same channel; an adder 36 for mixing the first and fifth parallel data PData1 and PData5 and outputting the mixed data as sixth parallel data PData6; a second selector 37 for selecting a maximum value in the case that a value outputted in the adder 36 is over a maximum value OxFFFF of 16 bits, or, if not, selecting the added value, thereby outputting the selected value as seventh parallel data PData7, to prevent an overflow; a latch 38 for receiving the continually varying seventh parallel data PData7 to generate eighth data PData8 stabilized during one channel interval; and a parallel-serial converter 39 for loading a signal which is the inverse of a latch clock S operating the latch 38 and for converting the eighth data PData8 stabilized during one channel interval into serial data by using the first bit clock BCLK1.

A detailed explanation on an operation of the serial digital audio signal mixing circuit constructed as described above will be given hereinafter with reference to FIG. 8.

Figure 8:
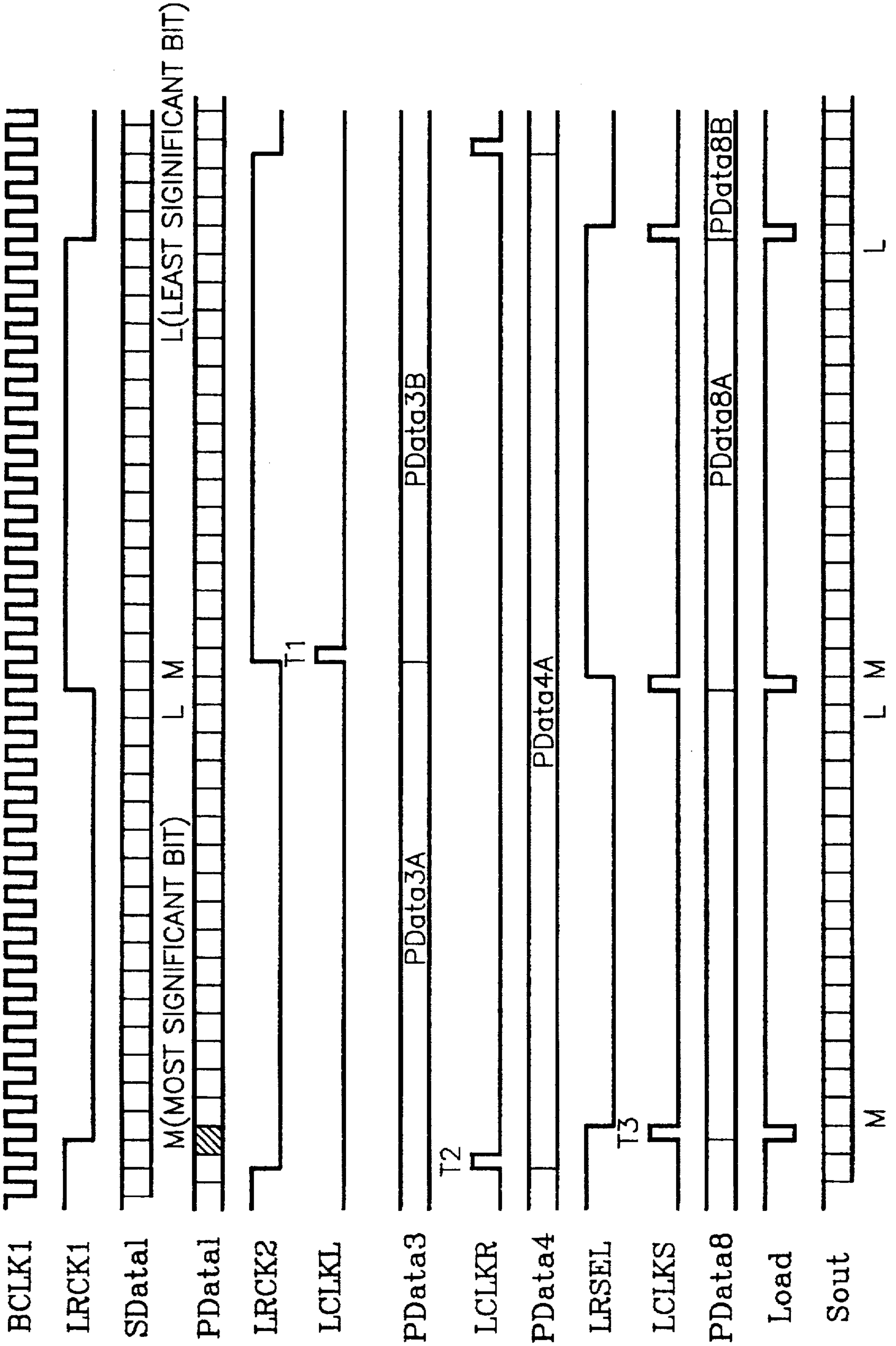
FIG 8 is a timing diagram illustrating digital audio signal mixing processes according to yet another embodiment of the present invention.

In FIG. 8, digital audio data generated at a sampling frequency A is converted into parallel data PData1 in the first serial-parallel converter 31 by inputting the serial data SData1 and the clock BCKL1 corresponding to the serial data SData1. Meanwhile, digital audio data generated at a sampling frequency B is converted into parallel data PData2 in the second serial-parallel converter 32 by inputting the serial data SData2 and the clock BCKL2 corresponding to the serial data SData2. One blank of the serial data SData1 shown in FIG. 8 represents 1 bit, and one blank of the parallel data PData1 shown in FIG. 8 represents 16 bits. As described above, even if the parallel data PData1 is different from the serial data SData1 in terms of the number of bits representing one blank, the parallel data PData1 and the serial data SData1 are expressed to be similar to each other. That is why the parallel data of 16 bits is correspondingly varied whenever 1 bit of the serial data is inputted. Accordingly, all the parallel data shown in FIG. 8, such as PData3A, PData3B, PData4A, PData8A, and PData8B are 16 bits.

Since the two parallel data PData1 and PData2 have sampling frequencies different from each other, phases thereof are different from each other. Further, as the serial data is continually inputted, the outputted parallel data is also continually varied. Hence, if these data are unconditionally mixed, the phases thereof are distorted, by which undesired data is mixed. Therefore, the parallel data PData2 should be maintained as the parallel data stabilized at the time that the two digital audio data are mixed. Thus, in an embodiment according to the present invention, as shown in FIG. 8, a first latch clock LCLKL converts PData2 into the parallel data PData3 in the first latch 33 of FIG. 7 at the time T1 that data of the left channel is generated. Also, as shown in FIG. 8, a second latch clock LCLKR converts PData2 into the parallel data PData4 in the second latch 34 of FIG. 7 at the time T2 that data of the right channel is generated. As shown in FIG. 8, one of the two parallel data PData3 and PData4 is selected and converted into the parallel data PData5 in the first selector 35 of FIG. 7 by means of the signal LRSEL representing whether the parallel data PData1 is data of the left channel or data of the right channel.

The parallel data PData1 and PData5 are mixed in the adder 36 and converted into the new parallel data PData6. At this time, if a value which mixes the two parallel data in the adder 36 is not over the maximum value OxFFFF of 16 bits, a carry terminal ca is in the logic "low" state, thereby selecting the parallel data PData6 of the output of the adder 36 and outputting the selected data as the parallel data PData7 in the second selector 37. However, if the value is over the maximum value OxFFFF of 16 bits, the carry terminal ca is in the logic "high" state, thereby selecting not the parallel data PData6 of the output of the adder 36 but the maximum value OxFFFF of the parallel data and outputting the selected data as the parallel data PData7 in the second selector 37, thereby preventing an overflow.

Now that the output of the adder 36 is continually varied in accordance with a variance of the input data, the third latch 38 latches parallel data PData7 from second selector 37 by using a third latch clock LCLKS shown in FIG. 8 and generates the parallel data PData8 as shown in FIG. 8. The respective parallel data of FIG. 8, such as PData8A and PData8B of FIG. 8 is designated to discriminate values generated every time, but these parallel data can be conveniently all designated as PData8.

Generation of the parallel data PData8 will be specifically explained hereinafter. As shown in FIG. 8, after mixing the parallel data PData3A of the left channel and effective data (portion hatched in the parallel data PData1 of FIG. 8) in the parallel data PData1 and latching the mixed data by the third latch clock LCLKS at a specific time T3, the parallel data PData8A is generated. Further, after mixing the parallel data PData4A of the right channel and effective data in the parallel data PData1, the parallel data PData8B is generated by the third latch clock LCLKS. The parallel data PData8B should be again converted into serial data in order to be inputted to a general digital/analog converter which converts the serial data into analog data. Accordingly, while being converted into the serial data by using the serial-parallel converter 39 of FIG. 7, the parallel data PData8 is loaded to the serial-parallel converter 39 by using a load signal of FIG. 8 and converts the parallel data into the serial data SOut by using the clock BCLK1 of the serial data SData1 shown in the timing diagram of FIG. 8. Here, one blank of the serial data SOut shown in FIG. 8 represents 1 bit.

As stated hereinbefore, when compared with the conventional digital audio signal circuit which necessarily requires a plurality of digital/analog converters in accordance with the number of sources of digital audio signals, the present invention requires only one digital/analog converter. Therefore, it is advantageous in that the production cost may be greatly reduced and the structure of the circuit may be simple. In addition, if the present invention is constructed with an application-specific integrated circuit (ASIC), the production cost may be further reduced and the number of components composing the circuit may be decreased, thereby enabling a reduction in the dimensions of the associated apparatus.

While the present invention has been particularly shown and described in the detailed description thereof, it will be understood by those skilled in the art that various changes in form and details may be effected therein without departing from the spirit and scope of the present invention. In particular, while the present invention has been illustrated with the case of mixing audio signals having two sampling frequencies, it is possible to adapt the identical method to the present invention in the case of mixing audio signals having two or more sampling frequencies. Therefore, it should be understood that the present invention is not limited to the specific embodiments described in this specification except as defined in the appended claims.

What is claimed is:

1. A circuit for mixing two digital audio signals which have sampling frequencies different from each other and for generating the mixed data in an analog format, comprising:

first serial-parallel converting means for converting first serial digital audio data into first parallel data in synchronism with a first bit clock;

second serial-parallel converting means for converting second serial digital audio data into second parallel data in synchronism with a second bit clock;

first and second latching means for converting continually varying second parallel data into parallel data stabilized in one channel area, for respectively separating said converted parallel data into third data of a left channel and fourth data of a right channel, and for temporarily storing said separated data;

first selecting means for selectively outputting one of said third and fourth data as fifth data in response to a signal representing whether said first parallel data is data of said left channel or data of said right channel, thereby mixing said data associated with a respective channel;

adding means for mixing said first and fifth parallel data and outputting said mixed data as unitary sixth parallel data;

parallel-serial converting means for converting said sixth parallel data into serial data in synchronism with said first bit clock; and digital/analog converting means for converting data outputted in said parallel-serial converting means into an analog format.

2. The circuit as claimed in claim 1, further comprising second selecting means connected between said adding means and said parallel-serial converting means, for selectively providing to said parallel-serial converting means a maximum value in the case that said sixth parallel data is over said maximum value of 16 bits, or said sixth parallel data in the case that said sixth parallel data is not over said maximum value of 16 bits, thereby preventing an overflow.

3. The circuit as claimed in claim 2, further comprising latching means connected between said second selecting means and said parallel-serial converting means, for maintaining output data of said continually varying second selecting means in a state stabilized in one channel area.

4. A circuit for mixing a plurality of digital audio signals which have sampling frequencies different from one another and for generating the mixed data of an analog format, comprising:

serial-parallel converting means for converting serial digital audio data having various formats into parallel audio data in synchronism with a corresponding bit clock;

adding means for mixing a plurality of said parallel audio data and outputting said mixed data as unitary parallel audio data;

parallel-serial converting means for converting said unitary parallel audio data into serial data in synchronism with a specific bit clock; and digital/analog converting means for converting data outputted in said parallel serial converting means into an analog format.

5. A circuit for mixing a plurality of digital audio signals which have sampling frequencies different from one another and for generating the mixed data of an analog format, comprising:

serial-parallel converting means for converting serial digital audio data having various formats into parallel data in synchronism with a corresponding bit clock;

adding means for mixing a plurality of said parallel data and outputting said mixed data as unitary parallel data;

parallel-serial converting means for converting said parallel data into serial data in synchronism with a specific bit clock;

digital/analog converting means for converting data outputted in said parallel serial converting means into an analog format; and second selecting means connected between said adding means and said parallel-serial converting means, for selectively providing to said parallel-serial converting means a maximum value in the case that an output of said adding means is over said maximum value of 16 bits, or said output of said adding means in the case that said output of said adding means is not over said maximum value of 16 bits, thereby preventing an overflow.

6. The circuit as claimed in claim 5, further comprising latching means connected between said selecting means and said parallel-serial means, for maintaining output data of said continually varying second selecting means in a state stabilized in one channel area.

7. The circuit as claimed in any of claims 5 to 6, further comprising latching means for converting a plurality of continually varying parallel data into parallel data stabilized in one channel area.

8. The circuit as claimed in claim 7, wherein said latching means respectively separates said data by the data into third data of the left and fourth data of the right and stores said separated data.

9. The circuit as claimed in claim 8, further comprising first selecting means for selectively outputting one of said third and fourth data in response to a signal representing whether parallel data corresponding to serial data of an arbitrary format is data of said left channel or data of said right channel, thereby mixing said output data with data associated with a respective channel.

10. The circuit as claimed in claim 8, further comprising first selecting means for selectively outputting one of said third and fourth data in response to a signal representing whether parallel data corresponding to serial data of an arbitrary format is data of said left channel or data of said right channel, thereby mixing said output data by the data associated with a respective channel.

11. A circuit for mixing serial digital audio data signals which have sampling frequencies different from each other, comprising:

a first serial-parallel converter for receiving a first serial digital audio data signal according to a falling edge of a bit clock, sequentially converting and outputting the received serial digital audio data into first parallel digital audio data;

a second serial-parallel converter for receiving a second serial digital audio data signal having a sampling frequency different from said first serial digital audio signal, sequentially converting and outputting the received serial digital audio data as second parallel digital audio data;

first and second latch generators for delaying a channel discriminating clock maintaining a specific state during one clock period of time in synchronism with a high frequency clock, whenever left and right channels are replaced with each other, exclusively logic-ORing said delayed clock with said channel discriminating clock, and generating first and second latch clocks;

a first latch for latching during a given period of time said second parallel digital audio data which said second serial-parallel converter converts and outputs in the case that said first latch clock is applied, and outputting said latched second parallel digital audio data as third parallel digital audio data;

an adder for receiving and operating on each of said first parallel digital audio data outputted by said first serial-parallel converter and said third parallel digital audio data outputted by said first latch, and converting the received first and third parallel digital audio data into fourth parallel digital audio data;

a second latch for latching during said given period of time said fourth parallel digital audio data which said adder outputs in the case that said second latch clock is applied and outputting said latched fourth parallel digital audio data as fifth parallel digital audio data; and a parallel-serial converter for inputting by a given load clock said fifth parallel digital audio data outputted by said second latch, converting and outputting said inputted parallel digital audio data as output serial data in synchronism with a converting clock of said bit clock.

12. The circuit as claimed in claim 11, wherein left and right channels of said serial digital audio data, respectively, each have quantum numbers of 16 bits, and said output serial digital audio data is outputted 16 bits by 16 bits in parallel.

13. The circuit as claimed in claim 11, wherein said first and second serial-parallel converters convert input data into serial format by using a shift register and said parallel serial converter converts input data into parallel format by using a shift register.

14. The circuit as claimed in claim 11, further comprising means for selecting a maximum value in the case that an output of said adder is over said maximum value of 16 bits, or said output of said adder in the case that said output of said adder is not over said maximum value of 16 bits, thereby preventing an overflow.

* * * * *